United States Patent [19]

Nygaard, Jr.

[11] Patent Number: 4,477,920
[45] Date of Patent: Oct. 16, 1984

[54] VARIABLE RESOLUTION COUNTER

[75] Inventor: Richard A. Nygaard, Jr., Colorado Springs, Colo.

[73] Assignee: Hewlett-Packard Company, Palo Alto, Calif.

[21] Appl. No.: 352,673

[22] Filed: Feb. 26, 1982

[51] Int. Cl.³ .................... H03K 21/34; H03K 21/36
[52] U.S. Cl. .................................. 377/52; 377/55; 377/56; 377/34
[58] Field of Search ............... 377/34, 52, 44, 27, 377/55, 56, 111, 110

[56] References Cited

U.S. PATENT DOCUMENTS

| | | | |
|---|---|---|---|
| 2,937,337 | 5/1960 | Jones et al. | 328/48 |
| 3,260,839 | 7/1966 | Brown | 377/44 |
| 3,263,174 | 7/1966 | Bjorkman et al. | 328/25 |
| 3,657,658 | 4/1972 | Kubo | 328/61 |
| 3,705,296 | 12/1972 | Kochi | 377/27 |
| 4,127,823 | 11/1978 | Frost | 328/130 |

Primary Examiner—John S. Heyman
Attorney, Agent, or Firm—Jon R. Stark

[57] ABSTRACT

A variable resolution counter is provided in which the resolution of the count decreases as the counted value increases. A set of scale control bits from the most significant bits of the counter are used to control selection of one of several prescaled signals from a prescaler. Resetting of the count value may be made conditional on the value of the count, and a flag may be provided to effectively redistribute the capacity of the counter between high and low resolution modes. A gray code of particular interest is also disclosed.

4 Claims, 4 Drawing Figures

VARIABLE RESOLUTION COUNTER

BACKGROUND AND SUMMRY OF THE INVENTION

In many digital logic applications it is desirable to employ a counter which keeps a tally of time elapsed or of the number of occurrences of a particular kind of event. Such a counter may be described in terms of its range, meaning the maximum variation possible in the value stored in the counter, and its resolution, meaning the minimum separation between consecutive values stored in the counter. Ideally, a counter would have a very large range to permit it to operate for a long period of time or over a large number of events, and high resolution to permit detection of changes in the count value between closely spaced times or events.

Counters available in the prior art generally provided a fixed combination of range and resolution. For a fixed number of significant digits in a counter, achieving a large range required sacrificing high resolution, while high resolution could only be obtained at the expense of range. A single counter could not provide both large range and high resolution without using an extremely large number of significant digits, which required more memory, complexity, and cost than desired.

In accordance with the preferred embodiments of the present invention, a counter provides resolution which varies with the value of the stored count. This permits high resolution when the stored value is low, with decreasing resolution as the value of the count increases. Large range may be achieved without sacrificing high resolution at the low end of the range.

Resolution of the count is determined by a prescaler, which provides several selectable resolutions. A selector monitors the value of the most significant digits stored in the count, and selects one of the available resolutions from the prescaler in response to value of thos digits.

In one embodiment, a gray code counter is used to permit asynchronous sampling of the count value. Another embodiment effectively increases the range available at the highest resolution, by splitting the range associated with one combination of the most significant digits. Resetting of the counter can also be made conditional on the value of the stored count.

DESCRIPTION OF THE PREFERRED EMBODIMENTS

Figure 1:
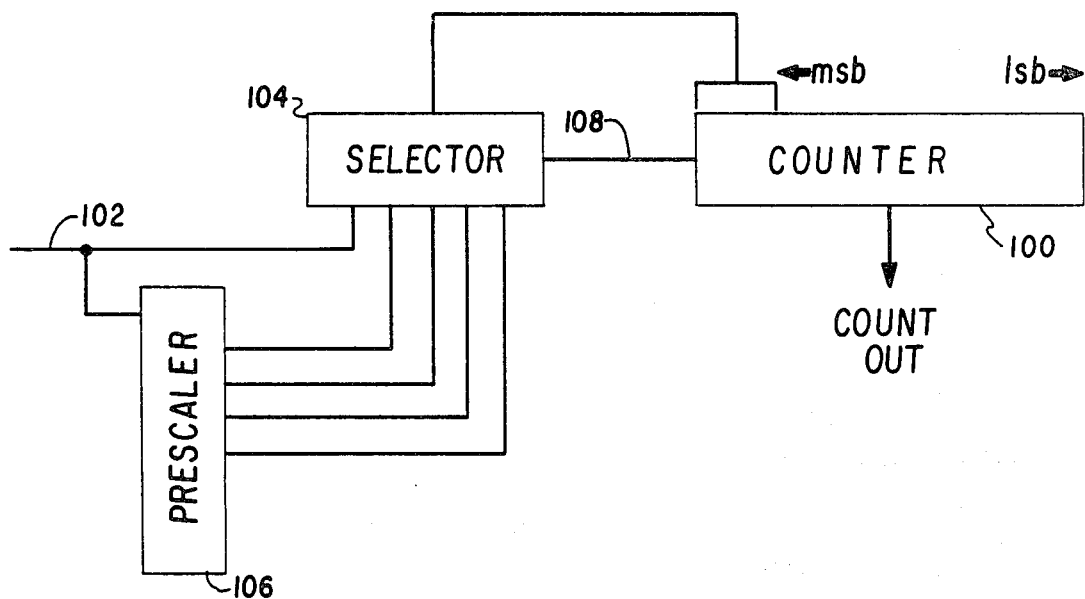
FIG. 1 shows a variable resolution counter having a prescaler and a selector.

Operation of a first embodiment of the present invention may be understood by referring to FIG. 1. A counter 100 will keep a tally of events or time signals occurring on line 102. For ease of explanation, line 102 may be assumed to be connected to a 25 mhz clock, so that counter 100 can store values representing elapsed times. Types of events other than time signals can also be counted by counter 100, depending on the source of the signals on line 102.

Counter 100 may be, for example, a binary counter. As depicted in FIG. 1, the most significant bits appear to the left of the counter, and the least significant bits to the right. Some of the bits are chosen as scale control bits, and are used to control a selector 104. For a twenty bit binary counter, the scale control bits may be chosen to be the three most significant bits of counter 100. These scale control bits serve a dual function, in that their values constitute part of the count value, as well as provide information for the selector 104 to use in selecting the appropriate resolution.

A prescaler 106 provides several different signals to selector 104. Each such signal represents a prescaled version of the signal on line 102, for example, by providing pulses which occur only after a fixed number of events on line 102. Four scaled signals are shown in FIG. 1, although any other number can be provided, if convenient.

Selector 104 will respond to the scale control bits by choosing the signal on line 102 or one of the prescaled signals from prescaler 106. The selected signal is then passed to counter 100 on line 108 for incrementing the value of the count.

Figure 2:
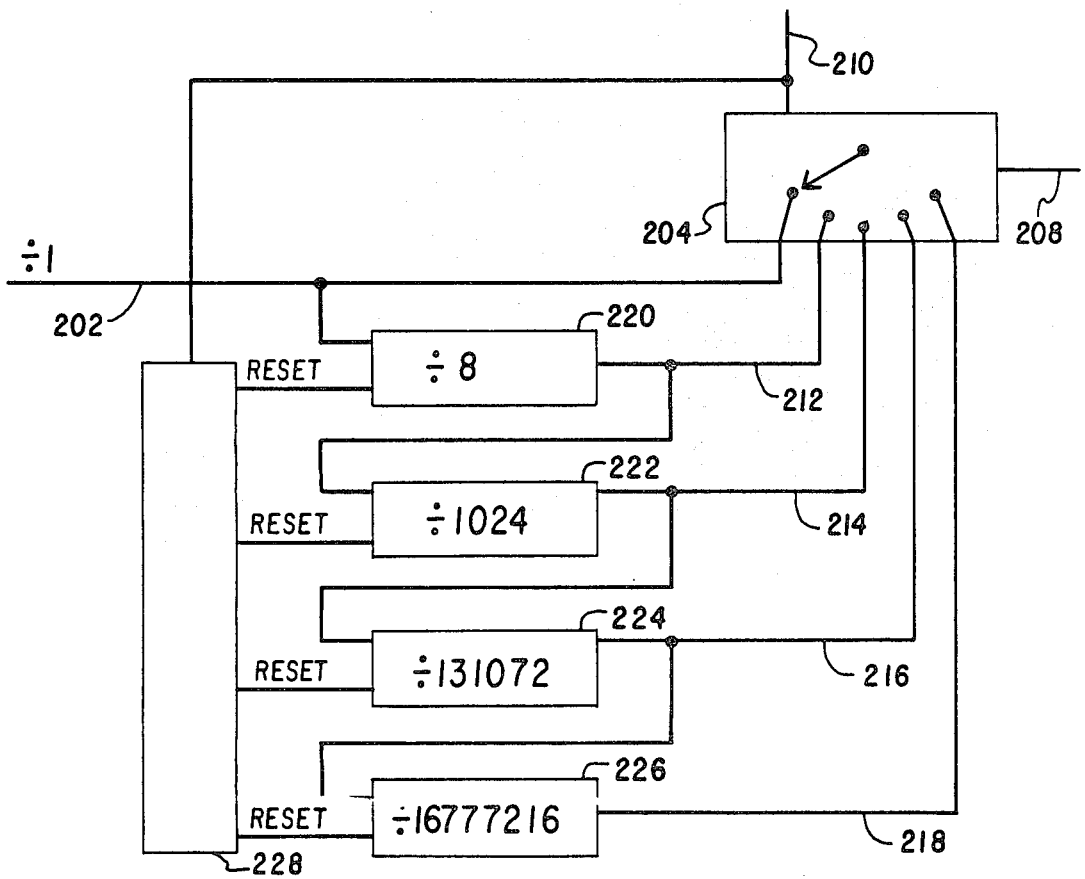
FIG. 2 shows a prescaler and a selector suitable for use in a variable resolution counter.

One preferred implementation of the prescaler and selector is illustrated in FIG. 2. Selector 204 selects a signal from one of five lines, to be provided to a counter on line 208. Scale control bits from the counter are provided on line 210 for controlling the selection. Line 202 carries the original, unscaled signal, while lines 212, 214, 216, and 218 carry prescaled signals. As the scale control bits change, indicating increasing value stored in the count, selector 204 can select prescaled signals to lower the resolution of the counter, permitting a larger range to be stored while preserving high resolution for low count values.

Four scalers 220, 222, 224, and 226 provide the prescaled signal. Each may be, for example, a binary ripple through counter. Three bits may be used for scaler 220, and seven bits for each of 222, 224, and 226. This combination permits prescaling by factors of 8, 1024, 131072, and 16777216, as well as the unscaled original signal. Five different resolutions are thus available to be selected by selector 204. The prescaling factors may be chosen to suit a particular application, and the number of prescaling factors may be changed, if desired.

A logic device 228 may be used to control resetting of scalers 220 through 226. It is desirable to keep those scalers which are not being used at any given time, held in the reset state, so that when each is eventually selected it will have no extraneous contents, to prevent inaccuracies in the count. Device 228 may thus be any number of devices which will function like a wiping switch, so that the reset lines are on for each scaler below the one currently selected by selector 204. The scale control bits are provided to device 228 along line 210 so that resetting can be changed as each successive prescale factor is selected.

Figure 3:
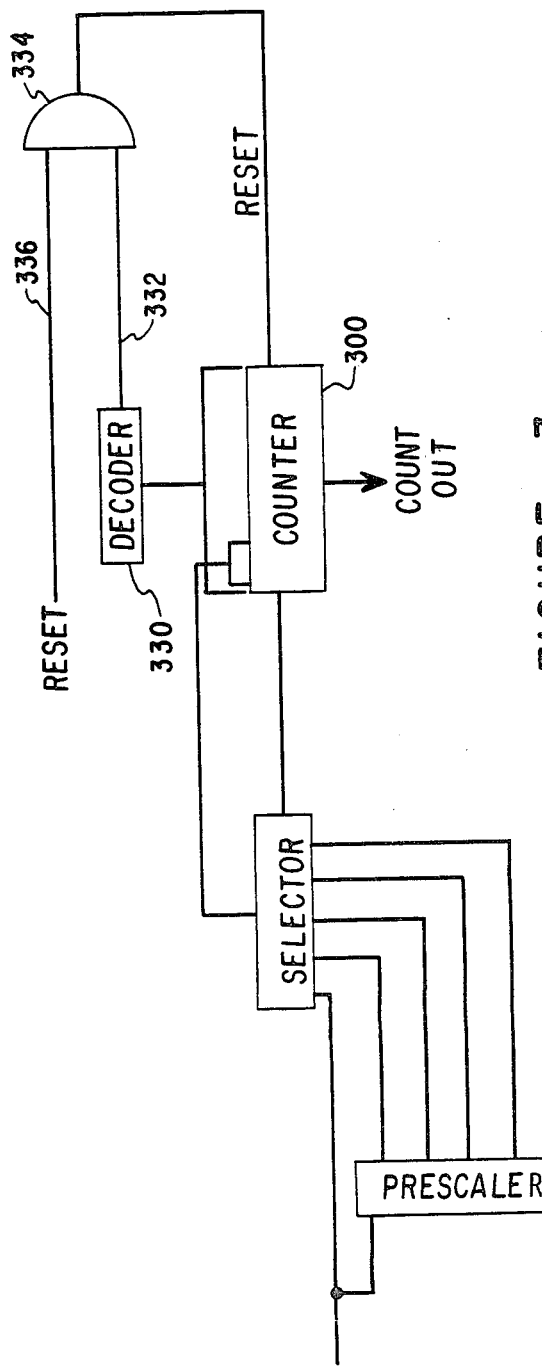
FIG. 3 shows a variable resolution counter having a conditional reset feature.

Resetting of the counter itself may be made conditional upon the value of the stored count. FIG. 3 shows one possible implementation of this feature. A decoder 330 receives bits from counter 300. Decoder 330 will provide a signal on line 332 whenever the value of the count is such that resets of the counter are permitted. An AND gate 334 operates on the signal on line 332 and on reset commands on line 336, so that resetting of the counter can be defeated by decoder 330. It may be useful to prevent resets when the value of the count is very low to prevent loss of significant data. For example decoder 330 may be configured to prevent resets of the counter whenever the counter is less than half full in the highest resolution range.

Another embodiment of the invention uses a gray code counter instead of a binary counter. One particular gray code proves to be especially useful. Assuming for exemplary purposes that a twenty bit counter is desired, the gray code can be formed in the following manner. Let the bits be labelled $b_0$ through $b_{19}$, with $b_0$ the rightmost, least significant bit. Envision another "control" bit to the right of $b_0$ which merely toggles each time the count changes, and an arbitrary string of zeros to the right of the control bit. The control bit may be thought of as bit $b_{n-1}$. Then the rule for constructing the gray code can be stated as: toggle $b_n$ of bits $b_0$ to $b_{19}$ if $b_{n-1}=1$ and all bits right of $b_{n-1}$ are zero.

This scheme for constructing the gray code is advantageous because the most significant bits chosen to be the scale control bits will only change when the field to the right is a 1 followed by zeros, or all zeros. Consequently, when the scale control bits change and the selector chooses a new resolution, the rightmost bits all start at zero before counting in the new resolution.

A gray code is desirable because it permits asynchronous sampling of the count value. Since only one bit will change for each count, minimal loss of information occurs if the count is sampled while it is changing. The particular gray code disclosed above is easily implemented in a logic family providing open emitter outputs or their equivalent.

Figure 4:
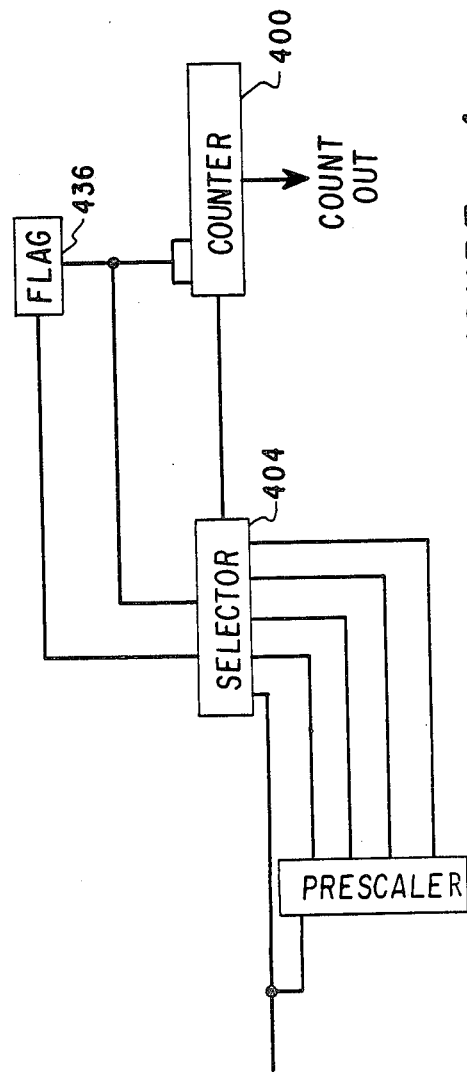
FIG. 4 shows a variable resolution counter having a high resolution flag.

An additional feature of the present invention may be understood by referring to FIG. 4. In the lowest resolution, highest range mode, the counter may have much more range than is needed. This capacity could perhaps be better used to increase the effective range of the highest resolution mode. To accomplish this, the sequence of scale control bits which normally indicates the lowest resolution mode may be used in two distinct fashions.

The key to this approach is resetting the count to a non-zero value roughly midway through the count, permitting one of the sequence of scale control bits to serve for two different resolutions. A flag may be set to indicate whether the highest resolution or lowest resolution mode is in use at the time. The flag 436 may be set in response to the scale control bits from counter 400. Selector 404 then uses the flag to select the appropriate prescaling. Effectively, the counter capacity corresponding to one set of scale control bits is split between the highest and lowest resolution modes. Thus, three bits of scale control information can effectively serve nine different counting modes.

I claim:

1. A variable resolution counter for counting events indicated by an input signal, comprising:
   prescaler means for providing a plurality of scaled signals in response to said input signal;
   counter means for incrementing a value in response to a first signal, and for providing a second signal indicative of a preselected set of the most significant digits of said value;
   count output means, for providing a count out signal to permit sampling of said value; and
   selector means connected to the prescaler means and the counter means, for selecting said first signal from one of the plurality of scaled signals, in response to said second signal.

2. A variable resolution counter as in claim 1 further comprising reset disabling means connected to the counter means, for preventing resetting of the value in said counter means in response to the magnitude of the value.

3. A variable resolution counter as in claims 1 or 2 wherein the counter means is configured to represent the value in a gray code.

4. A variable resolution counter as in claim 3 further comprising flag means for indicating which of the plurality of scaled signals is selected by the selector means.

* * * * *

UNITED STATES PATENT AND TRADEMARK OFFICE
CERTIFICATE OF CORRECTION

PATENT NO. : 4,477,920
DATED : October 16, 1984
INVENTOR(S) : Richard A. Nygaard, Jr.

It is certified that error appears in the above—identified patent and that said Letters Patent is hereby corrected as shown below:

Column 1, line 40, delete "thos" and insert "those"--;

Column 3, line 17, delete "$b_n-1.$" and insert "$b_{-1}.$".

Signed and Sealed this

Twenty-sixth Day of March 1985

[SEAL]

Attest:

DONALD J. QUIGG

*Attesting Officer*  *Acting Commissioner of Patents and Trademarks*